US012785639B2

(12) United States Patent
Furuhi et al.

(10) Patent No.: US 12,785,639 B2
(45) Date of Patent: Nov. 3, 2026

(54) SENSOR SIGNAL GENERATION DEVICE, SENSOR DEVICE AND COMMUNICATION DEVICE

(71) Applicant: Murata Manufacturing Co., Ltd, Kyoto (JP)

(72) Inventors: Tomoshige Furuhi, Kyoto (JP); Koji Kawano, Kyoto (JP); Takehiko Iizuka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 612 days.

(21) Appl. No.: 18/446,047

(22) Filed: Aug. 8, 2023

(65) Prior Publication Data

US 2023/0402981 A1 Dec. 14, 2023

Related U.S. Application Data

(63) Continuation of application No. PCT/JP2021/039398, filed on Oct. 26, 2021.

(30) Foreign Application Priority Data

Feb. 10, 2021 (JP) ................................. 2021-019521
Feb. 12, 2021 (JP) ................................. 2021-020669

(51) Int. Cl.
*H03F 3/70* (2006.01)
*G01P 15/125* (2006.01)
*G01P 15/08* (2006.01)

(52) U.S. Cl.
CPC .............. *H03F 3/70* (2013.01); *G01P 15/125* (2013.01); *G01P 2015/0865* (2013.01)

(58) Field of Classification Search
CPC ......... A63B 69/36; H03F 3/70; G01P 15/125; G01P 2015/0865; G01P 21/00; G08C 15/00; G01D 3/02
USPC .................................................. 473/324–330
See application file for complete search history.

(56) References Cited

U.S. PATENT DOCUMENTS 4,088,324 A * 5/1978 Farmer .............. A63B 69/3632 273/DIG. 26
4,792,230 A * 12/1988 Naganuma ............... G01J 11/00 356/450
6,048,276 A 4/2000 Vandergrift
10,067,156 B2 * 9/2018 Yonezawa ............... G01P 15/18
11,497,964 B1 * 11/2022 Hunter ................. A63B 53/005
(Continued)

FOREIGN PATENT DOCUMENTS

JP S54-068658 A 6/1979
JP S63-208913 A 8/1988
(Continued)

OTHER PUBLICATIONS

International Search Report for PCT/JP2021/039398 dated Jan. 18, 2022.

*Primary Examiner* — Michael A Cuff
(74) *Attorney, Agent, or Firm* — McDonald Hopkins LLC

(57) ABSTRACT

A sensor signal generation device includes a charge amplifier and a voltage amplifier circuit that convert a physical quantity of an observation target outputted from a sensor element into a voltage signal and output the voltage signal, and a correction unit that outputs a sensor signal obtained by correcting the voltage signal using frequency characteristics of the charge amplifier and the voltage amplifier circuit.

12 Claims, 7 Drawing Sheets

(56) References Cited

U.S. PATENT DOCUMENTS

| | | | | |
|---|---|---|---|---|
| 2002/0134153 | A1* | 9/2002 | Grenlund | A63B 59/50 473/233 |
| 2002/0134925 | A1* | 9/2002 | Grenlund | A63B 60/46 250/227.14 |
| 2005/0119036 | A1* | 6/2005 | Albanna | A63F 13/42 463/7 |
| 2008/0218343 | A1* | 9/2008 | Lee | A63B 60/00 340/568.1 |
| 2009/0033623 | A1* | 2/2009 | Lin | G06F 3/014 345/158 |
| 2012/0010510 | A1 | 1/2012 | Zeqiri | |
| 2013/0340524 | A1* | 12/2013 | Maeda | G01P 15/125 73/514.02 |
| 2017/0216692 | A1* | 8/2017 | Terada | A63B 60/46 |
| 2021/0197046 | A1* | 7/2021 | Murdock | A63B 67/02 |
| 2021/0213327 | A1 | 7/2021 | Ohta et al. | |
| 2021/0345939 | A1* | 11/2021 | Jumbe | A61B 7/04 |

FOREIGN PATENT DOCUMENTS

| | | | | |
|---|---|---|---|---|
| JP | H04-093653 | A | | 3/1992 |
| JP | H06-160359 | A | | 6/1994 |
| JP | 2005-172518 | A | | 6/2005 |
| JP | 2009-115537 | A | | 5/2009 |
| JP | 2010-243251 | A | | 10/2010 |
| JP | 2012-515569 | A | | 7/2012 |
| JP | 2014-094147 | A | | 5/2014 |
| JP | 2018033500 | A | * | 3/2018 |
| JP | 2018-175496 | A | | 11/2018 |
| KR | 10-0780676 | B1 | | 11/2007 |

* cited by examiner

SENSOR SIGNAL GENERATION DEVICE, SENSOR DEVICE AND COMMUNICATION DEVICE

CROSS REFERENCE TO RELATED APPLICATION

This is a continuation of International Application No. PCT/JP2021/039398 filed on Oct. 26, 2021 which claims priority from Japanese Patent Application No. 2021-019521 filed on Feb. 10, 2021 and Japanese Patent Application No. 2021-020669 filed on Feb. 12, 2021. The contents of these applications are incorporated herein by reference in their entireties.

BACKGROUND ART

Technical Field

The present disclosure relates to a technique for generating a sensor signal by converting a physical quantity outputted from a sensor.

Patent Document 1 describes a swing analysis device. The swing analysis device includes a sensor and a posture calculation unit.

The sensor is attached to a shaft of a golf club and outputs acceleration information, angular velocity information and distortion information of the shaft. The posture calculation unit calculates posture of the golf club in a period of a swing, based on the acceleration information and the angular velocity information. A correction unit corrects posture information at impact, based on the distortion information. The swing analysis device analyzes the swing by using the corrected posture information.

Patent Document 1: Japanese Unexamined Patent Application Publication No. 2018-175496

BRIEF SUMMARY

However, for example, when the distortion information of the sensor is used as is, there is limitation in suppressing an error of an analysis result.

The present disclosure generates a sensor signal from which an analysis result with higher accuracy may be obtained using a detection result of a sensor for an analysis target.

A sensor signal generation device of the present disclosure includes a voltage signal generation circuit configured to convert a physical quantity of an observation target outputted from a sensor element into a voltage signal and output the voltage signal, and a correction unit configured to output a sensor signal obtained by correcting the voltage signal using frequency characteristics of the voltage signal generation circuit.

In this configuration, even when the voltage signal generation circuit has the frequency characteristics, the frequency characteristics is corrected, and output as a sensor signal is performed.

According to the present disclosure, it is possible to generate a sensor signal from which an accurate analysis result with higher accuracy can be obtained.

1B is a functional block diagram of a correction unit of the sensor signal generation device.

Figure 2:
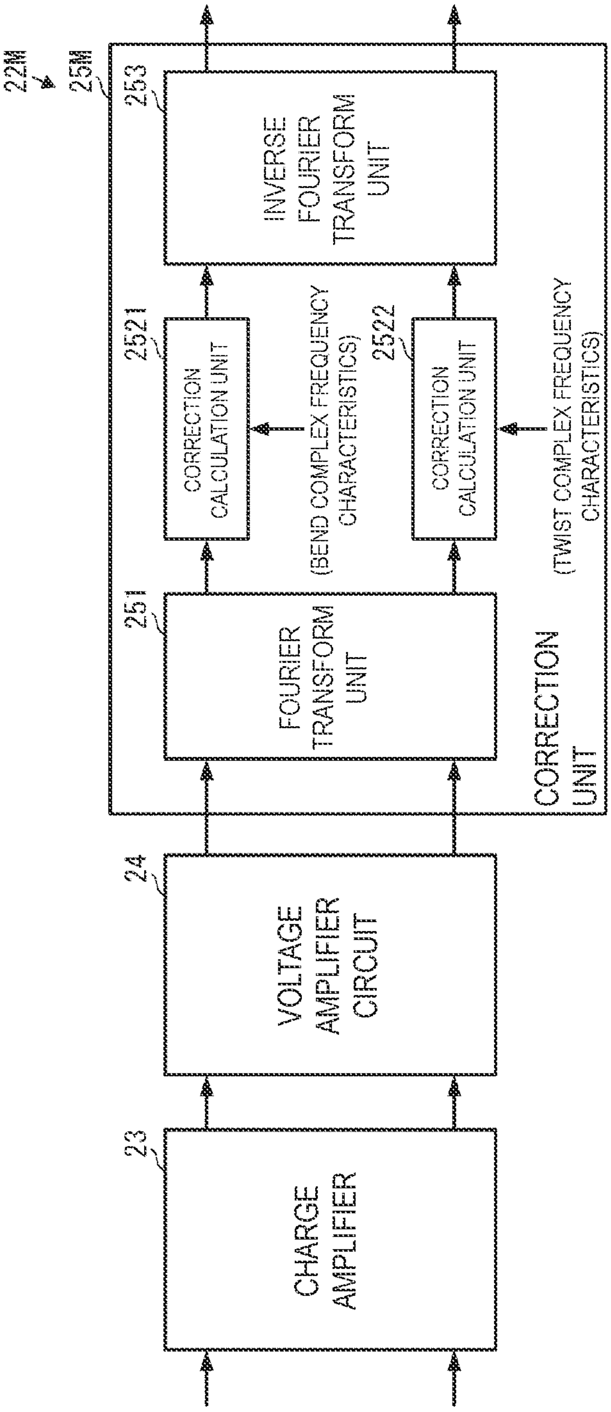

FIG. 2 is a functional block diagram of a multi-channel sensor signal generation device according to the first embodiment.

Figure 3A:
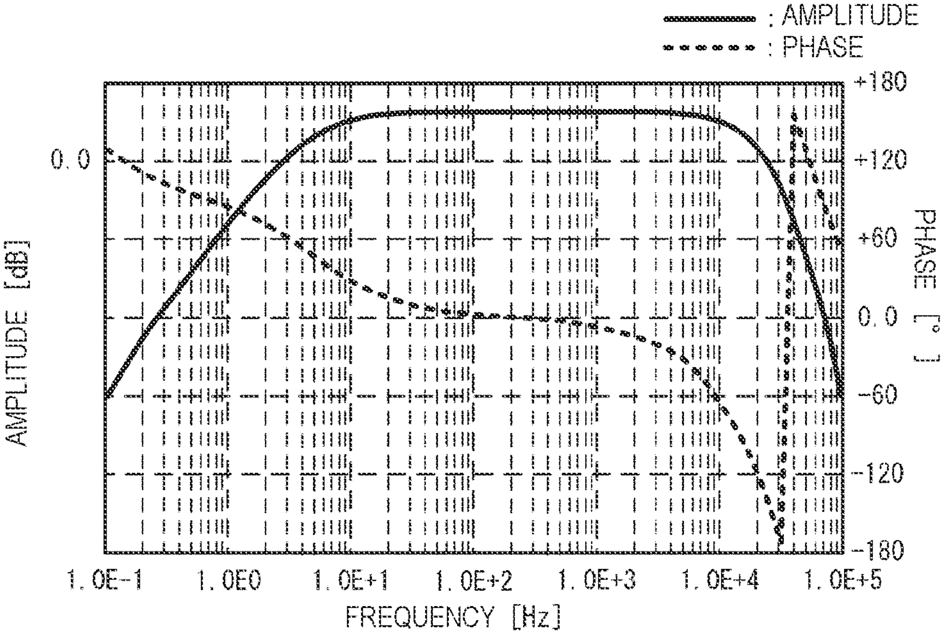
Figure 3B:
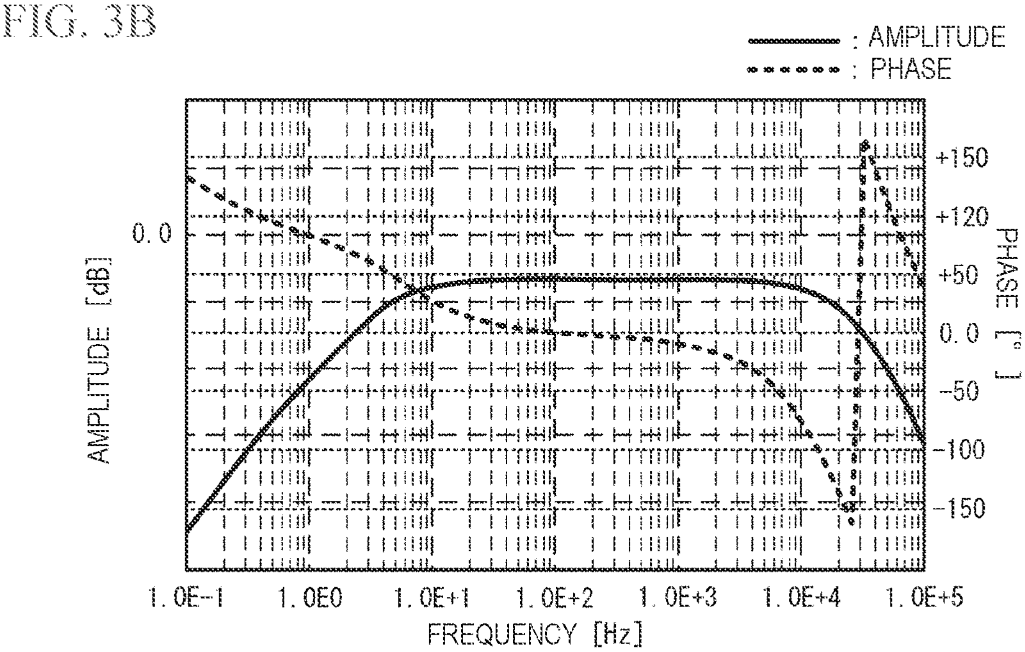

FIG. 3A is a graph depicting an example of amplitude-phase characteristics with respect to a bend detection voltage signal, and FIG. 3B is a graph depicting an example of amplitude-phase characteristics with respect to a twist detection voltage signal.

Figure 4A:
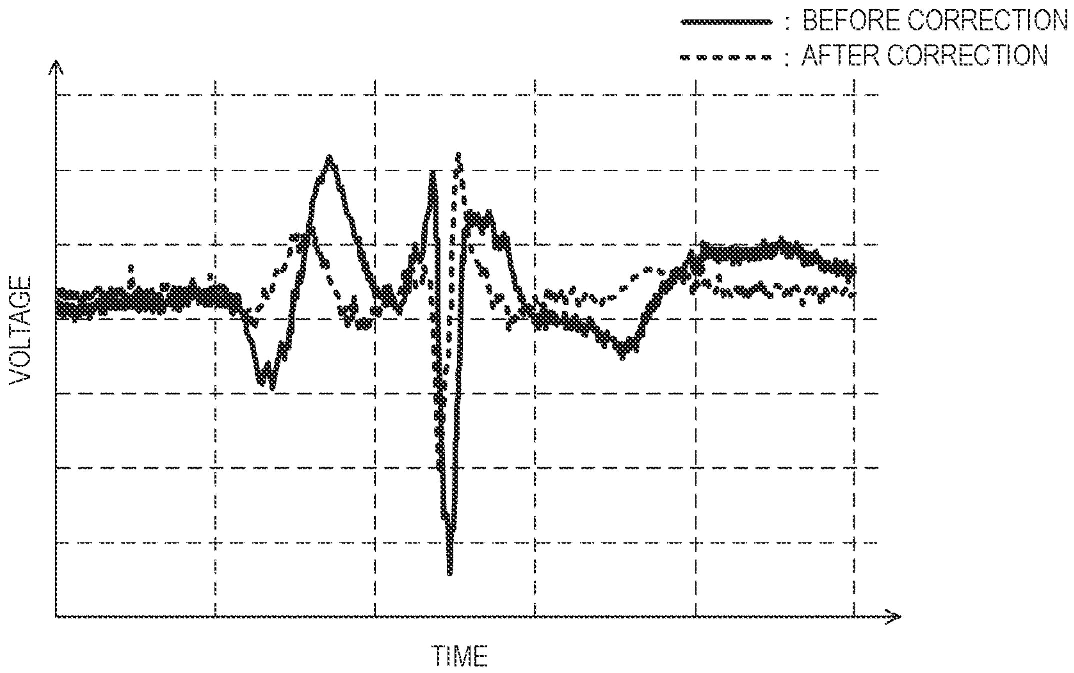
Figure 4B:
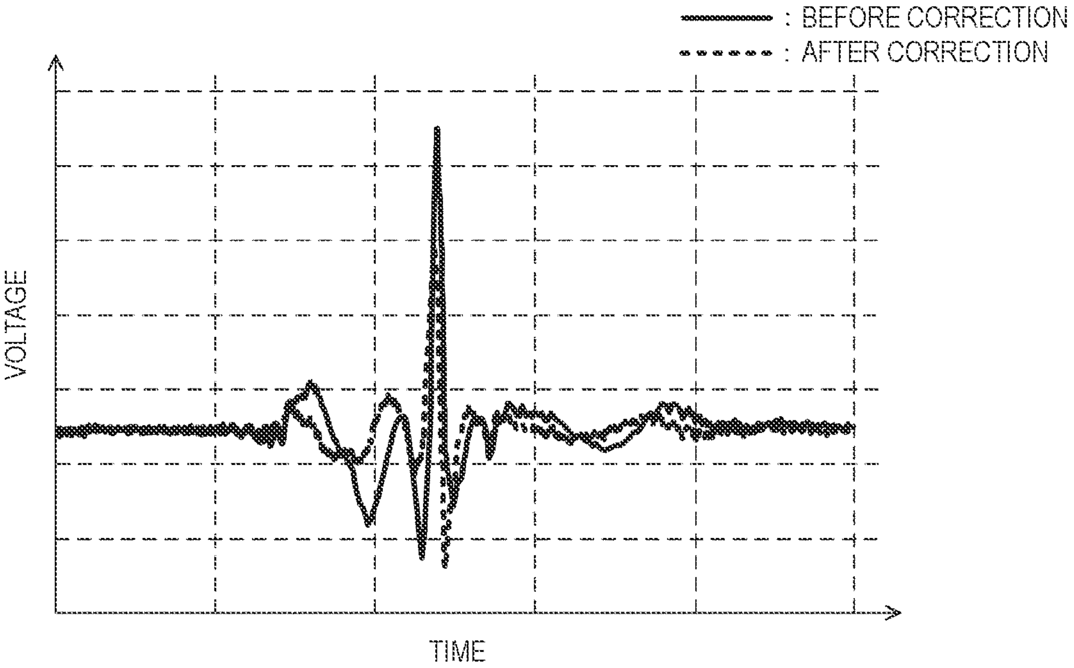

FIG. 4A is a graph depicting an example of waveforms of bend detection voltage signal before and after correction, and FIG. 4B is a graph depicting an example of amplitude-phase characteristics with respect to a twist detection voltage signal before and after correction.

Figure 5:
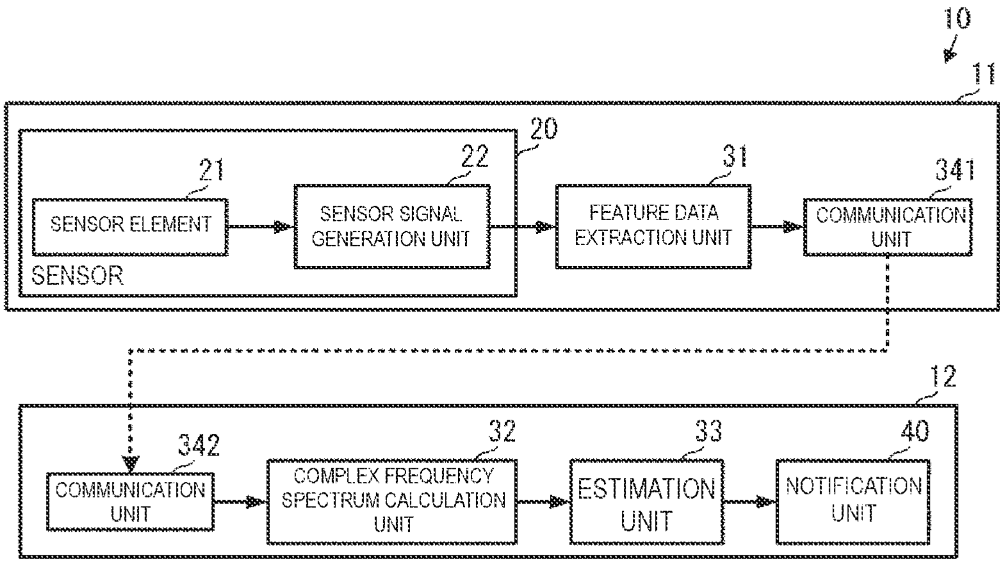

FIG. 5 is a functional block diagram of a swing state estimation device according to the first embodiment.

Figure 6:
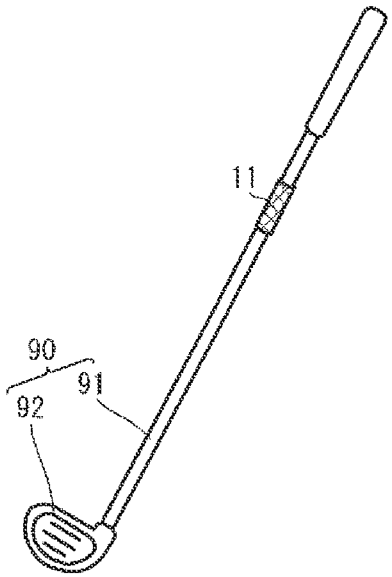

FIG. 6 is a diagram illustrating an example of an attachment state of a first electronic device of the swing state estimation device to a golf club.

Figure 7:
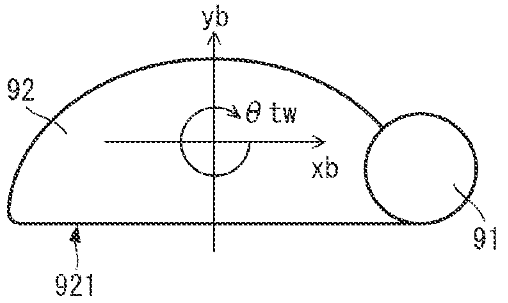

FIG. 7 is a schematic top view of a head of a golf club for defining bending and twisting.

Figure 8:
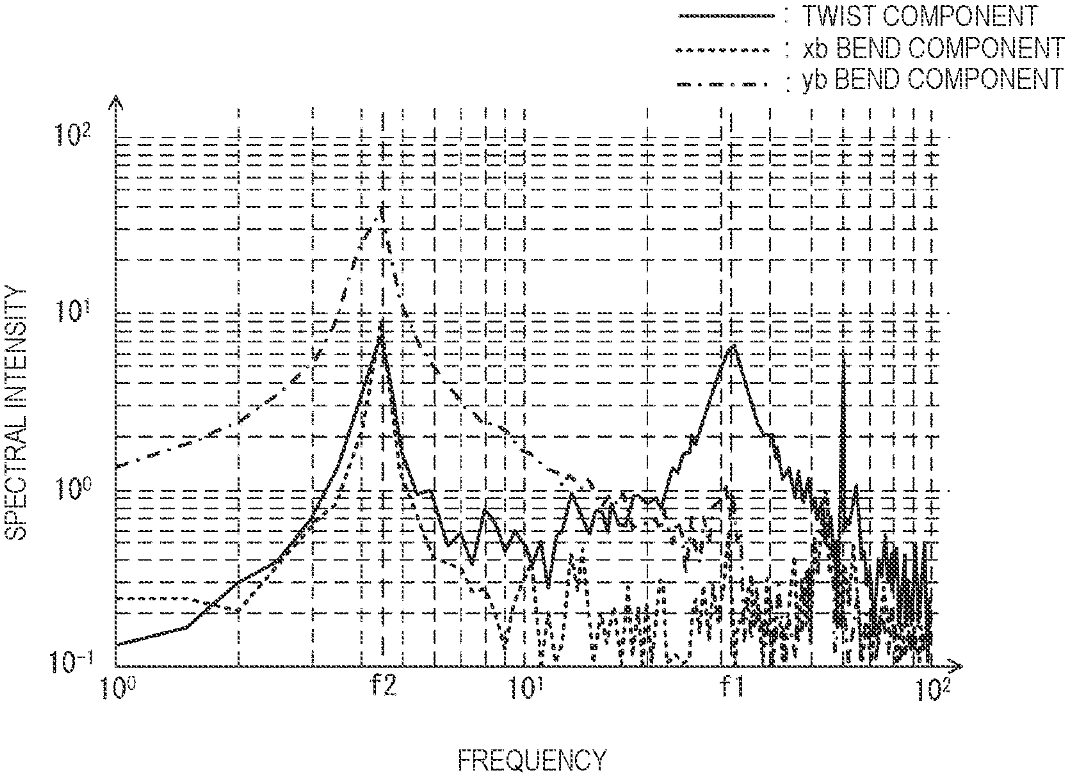

FIG. 8 is a graph depicting an example of complex frequency spectra.

Figure 9:
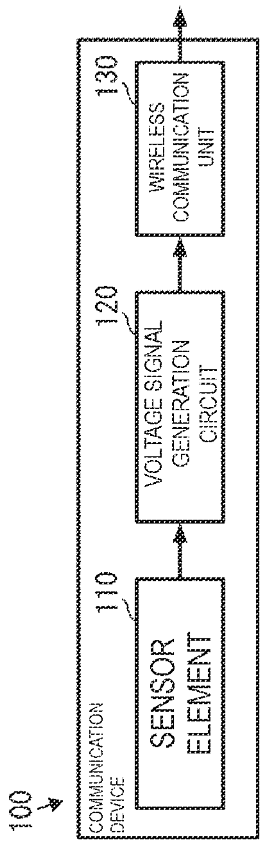

FIG. 9 is a block diagram of a communication device.

DETAILED DESCRIPTION

First Embodiment

A technique for generating a sensor signal according to a first embodiment of the present disclosure will be described with reference to the drawings.

(Case of Single Channel)

Figure 1A:
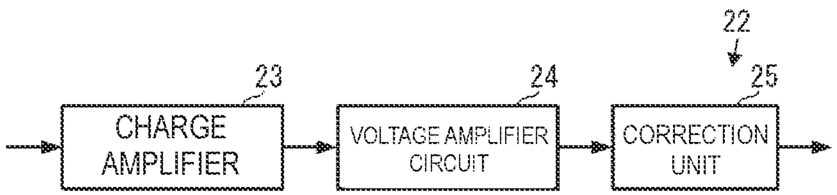
FIG. 1A is a functional block diagram of a sensor signal generation device according to a first embodiment, and FIG.
Figure 1B:
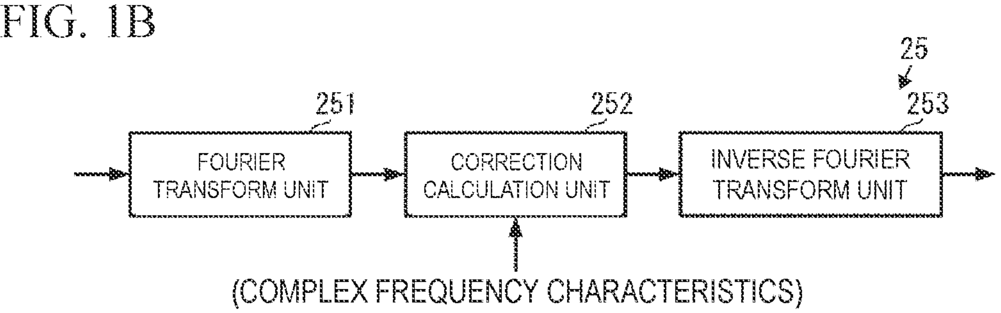

FIG. 1A is a functional block diagram of a sensor signal generation device according to a first embodiment, and FIG. 1B is a functional block diagram of a correction unit of the sensor signal generation device.

As illustrated in FIG. 1A, a sensor signal generation device 22 includes a charge amplifier 23, a voltage amplifier circuit 24 and a correction unit 25 (e.g., a processor). The charge amplifier 23 and the voltage amplifier circuit 24 constitute a "voltage signal generation circuit" of the present disclosure. The sensor signal generation device 22 is achieved by an electronic circuit including an IC, an electronic circuit element, and the like.

The charge amplifier 23 is connected to a sensor element 21 (see FIG. 5). The charge amplifier 23 converts charge outputted from the sensor element 21 into a voltage signal and outputs the voltage signal to the voltage amplifier circuit 24. The voltage amplifier circuit 24 amplifies the voltage signal and outputs the amplified voltage signal to the correction unit 25.

Schematically, the correction unit 25 performs Fourier transform on a voltage signal a(t) which is a time function outputted from the voltage amplifier circuit 24 to generate a voltage signal A(ω) which is a frequency function. Note that ω is an angular frequency and is defined by 2π times the frequency f.

The correction unit 25 corrects the voltage signal A(ω) which is the frequency function with complex frequency characteristics F(ω) to be described later to generate a voltage signal B(ω) which is a frequency function after the correction. That is, the correction unit 25 performs a calculation of $B(\omega)=A(\omega)/F(\omega)$.

The correction unit 25 performs inverse Fourier transform on the voltage signal B(ω) which is the frequency function after the correction to generate a voltage signal b(t) which is a time function.

In order to achieve this processing, as a more specific example, the correction unit 25 is provided with the following configuration and performs the following processing.

As illustrated in FIG. 1B, the correction unit 25 includes a Fourier transform unit 251, a correction calculation unit 252 and an inverse Fourier transform unit 253.

The Fourier transform unit 251 performs the Fourier transform on a voltage signal. In other words, the Fourier transform unit 251 transforms a voltage signal, which is a time function, into a frequency function.

The correction calculation unit 252 corrects the voltage signal after the Fourier transform with the complex frequency characteristics F(ω). The complex frequency characteristics F(ω) are set based on frequency characteristics fca(ω) of the charge amplifier 23 and frequency characteristics fva(ω) of the voltage amplifier circuit 24.

Specifically, the complex frequency characteristics F(ω) is set according to the following equation.

$$F(\omega) = fca(\omega) \times fva(\omega) \quad \text{(Equation 1)}$$

The frequency characteristics fca(ω) of the charge amplifier 23 is set according to the following equation.

(Formula 1)

$$fca(\omega) = \frac{1}{\left[\left(1 + \frac{C_c}{C_p}\right)\omega + \frac{1}{jR_cC_p}\right]} \quad \text{(Equation 2)}$$

Cc is capacitance of the charge amplifier 23, Rc is a resistance value of the charge amplifier 23 and Cp is capacitance of the sensor element 21.

The frequency characteristics fva(ω) of the voltage amplifier circuit 24 is set according to the following equation.

(Formula 2)

$$fva(\omega) = \frac{g\omega}{\left(1 + j\frac{\omega}{\omega_c}\right)} \quad \text{(Equation 3)}$$

g is a gain of the voltage amplifier circuit 24, and ωc is a cutoff frequency on a high frequency side of the voltage amplifier circuit 24.

That is, the complex frequency characteristics F(ω) is set according to the following equation.

(Formula 3)

$$F(\omega) = \frac{g\omega}{\left[\left(1 + \frac{C_c}{C_p}\right)\omega + \frac{1}{jR_cC_p}\right]\left(1 + j\frac{\omega}{\omega_c}\right)} \quad \text{(Equation 4)}$$

The correction calculation unit 252 outputs the corrected voltage signal to the inverse Fourier transform unit 253.

The inverse Fourier transform unit 253 performs inverse Fourier transform on the corrected voltage signal. The inverse Fourier transform unit 253 outputs the voltage signal after the inverse Fourier transform as a sensor signal.

By performing such correction, a voltage signal reflecting charge of the sensor element 21 as is and a sensor signal become signals having equivalent complex frequency spectra. That is, a sensor signal outputted from the sensor signal generation device 22 becomes a signal that reflects charge outputted from the sensor element 21 as is.

Accordingly, the sensor signal generation device 22 can output a sensor signal that reflects a physical quantity (charge) due to displacement of an observation target detected by the sensor element 21 with high accuracy. Thus, the sensor signal generation device 22 can generate a sensor signal from which an analysis result with higher accuracy for the observation target can be obtained.

(Case of Multi-Channel)

FIG. 2 is a functional block diagram of a multi-channel sensor signal generation device according to the first embodiment.

In the above description, an aspect has been described in which a voltage signal of one channel corresponding to charge generated by the sensor element 21 is generated. However, depending on the structure of the sensor element 21, it is also possible to generate voltage signals of a plurality of channels, each of which corresponds to individual charges with respect to a plurality of types of displacement of an observation target.

For example, when a swing state estimation device illustrated in FIG. 5 and FIG. 6 to be described later is configured, each voltage signal of a plurality of channels is caused to correspond to bending of a shaft and twisting of the shaft. Then, the sensor element 21 outputs charge (first channel charge) according to the bending of the shaft as a first channel, and outputs the charge (first channel charge) according to the twisting of the shaft as a second channel.

In this case, the sensor element 21 is provided with, for example, the following configuration. The sensor element 21 includes a main body having a film-like shape and having piezoelectric properties, a bend detection electrode, and a twist detection electrode. The main body contains, for example, polylactic acid as a main component and is polarized according to bending and twisting. At this time, a polarization direction changes according to a direction of the bending and a direction of the twisting, and magnitude of charge generated by the polarization differs according to magnitude of the bending and magnitude of the twisting. The bend detection electrode and the twist detection electrode are attached to a surface of the main body. In this case, the bend detection electrode is attached to the main body such that a large amount of charge due to the bending is generated, and the twist detection electrode is attached to the main body such that a large amount of charge due to the twisting is generated.

Thus, capacitance of the sensor element 21 for bend detection and capacitance of the sensor element 21 for twist detection may be different from each other. In such a case, it is suitable to use a configuration of a sensor signal generation device 22M illustrated in FIG. 2.

As illustrated in FIG. 2, the sensor signal generation device 22M includes the charge amplifier 23, the voltage amplifier circuit 24 and a correction unit 25M.

The charge amplifier 23 generates a bend detection voltage signal from charge outputted from a bend detection electrode. The charge amplifier 23 generates a twist detection voltage signal from charge outputted from a twist detection electrode.

The voltage amplifier circuit 24 outputs the bend detection voltage signal and the twist detection voltage signal to the correction unit 25M through individual channels.

The correction unit 25M includes the Fourier transform unit 251, a correction calculation unit 2521, a correction calculation unit 2522 and the inverse Fourier transform unit 253.

The Fourier transform unit 251 performs Fourier transform on the bend detection voltage signal and the twist detection voltage signal.

The correction calculation unit 2521 corrects the bend detection voltage signal after the Fourier transform with bend complex frequency characteristics Fb(ω).

$$Fb(\omega) = fcab(\omega) \times fva(\omega) \quad \text{(Equation 5)}$$

Here, frequency characteristics fcab(ω) of the charge amplifier 23 for the bend detection voltage signal are obtained by replacing the capacitance Cp in (Equation 2) with a bend detection capacitance Cpb.

The correction calculation unit 2521 outputs the corrected bend detection voltage signal to the inverse Fourier transform unit 253.

The correction calculation unit 2522 corrects the bend detection voltage signal after the Fourier transform with twist complex frequency characteristics Ft(ω).

$$Ft(\omega) = fcat(\omega) \times fva(\omega) \quad \text{(Equation 6)}$$

Here, frequency characteristics fcat(ω) of the charge amplifier 23 for the twist detection voltage signal are obtained by replacing the capacitance Cp in (Equation 2) with a twist detection capacitance Cpt.

The correction calculation unit 2522 outputs the corrected twist detection voltage signal to the inverse Fourier transform unit 253.

The inverse Fourier transform unit 253 performs inverse Fourier transform on the corrected bend detection voltage signal and the corrected twist detection voltage signal. The inverse Fourier transform unit 253 outputs the bend detection voltage signal after the inverse Fourier transform and the twist detection voltage signal after the inverse Fourier transform as sensor signals.

FIG. 3A is a graph showing an example of amplitude-phase characteristics with respect to bend detection voltage signal, and FIG. 3B is a graph showing an example of amplitude-phase characteristics with respect to twist detection voltage signal.

As described above, the frequency characteristics fca of the charge amplifier 23 depend on the capacitance Cc of the charge amplifier 23, the resistance value Rc of the charge amplifier 23, and the capacitance Cp of the sensor element 21. Thus, as shown in FIG. 3A and FIG. 3B, the amplitude-phase characteristics with respect to the bend detection voltage signal and the amplitude-phase characteristics with respect to the twist detection voltage signal are different from each other.

The correction unit 25M corrects a bend detection voltage signal by using the frequency characteristics in FIG. 3A. The correction unit 25M corrects a twist detection voltage signal by using the frequency characteristics in FIG. 3B.

FIG. 4A is a graph showing an example of waveforms of bend detection voltage signal before and after correction, and FIG. 4B is a graph showing an example of amplitude-phase characteristics with respect to twist detection voltage signal before and after correction.

As described above, by individually correcting the bend detection voltage signal and the twist detection voltage signal by the correction unit 25M, as shown in FIG. 4A and FIG. 4B, each of the bend detection voltage signal and the twist detection voltage signal is corrected with high accuracy to be a signal reflecting charge of the sensor element 21 as is.

(Example of Device Applied with Sensor Signal Generation Device)

As described above, the sensor signal generation device according to the present embodiment is applied to, for example, a swing state estimation device. FIG. 5 is a functional block diagram of a swing state estimation device according to the first embodiment. FIG. 6 is a diagram illustrating an example of an attachment state of a first electronic device of the swing state estimation device to a golf club.

As illustrated in FIG. 5, a swing state estimation device 10 includes a first electronic device 11 and a second electronic device 12. The first electronic device 11 and the second electronic device 12 are separate bodies. The first electronic device 11 includes a sensor 20, a feature data extraction unit 31, and a communication unit 341. The sensor 20 includes the sensor element 21 and the sensor signal generation device 22. The sensor signal generation device 22 is provided with the above-described configuration. Further, as described above, the sensor element 21 includes the main body having piezoelectric properties and the detection electrode.

As illustrated in FIG. 6, a golf club 90 includes a shaft 91 and a head 92. The shaft 91 is a linear rod body. The head 92 is installed at one end in a direction in which the shaft 91 extends. An end portion of the shaft 91 on a side opposite to an attachment position of the head 92 is a grip.

The first electronic device 11 is attached to the shaft 91. In the example of FIG. 6, the first electronic device 11 is attached to a vicinity of the grip of the shaft 91, but the attachment position of the first electronic device 11 to the shaft 91 is not limited thereto.

Accordingly, the sensor element 21 generates charge according to bending and twisting of the shaft 91, and the sensor 20 outputs a bend detection voltage signal and a twist detection voltage signal according to the charge. The bend detection voltage signal includes a bend component Sxb in an xb direction and a bend component Syb in a yb direction of the shaft 91. The twist detection voltage signal includes a twist component Sθtw of the shaft 91.

Here, bending of the shaft 91 in the xb direction, bending of the shaft 91 in the yb direction, and twisting of the shaft 91 are defined as follows, for example. FIG. 7 is a schematic top view of the head of the golf club for defining the bending and the twisting.

As illustrated in FIG. 7, the xb direction is a direction parallel to a face 921 of the head 92. The shaft 91 is attached to one end of the head 92 in the xb direction. A side of the head 92 to which the shaft 91 is attached is referred to as a heel side, and a side opposite to the side to which the shaft 91 is attached is referred to as a toe side.

In the xb direction, with a center of the head 92 as the origin, the heel side is a positive region and the toe side is a negative value. That is, the bend component Sxb in the xb direction becomes a positive value having a larger absolute value as bending toward the heel side increases, and becomes a negative value having a larger absolute value as bending toward the toe side increases.

As illustrated in FIG. 7, the yb direction is a direction perpendicular to the face 921 of the head 92. In the yb direction, with a center of the head 92 as the origin, a side of the face 921 is a negative region, and a side opposite to the face 921 side is a positive region. That is, the bend component Syb in the yb direction becomes a positive value having a larger absolute value as bending toward the side opposite to the face 921 side increases and becomes a negative value having a larger absolute value as bending toward the face 921 side increases.

As illustrated in FIG. 7, a twist θtw indicates a direction of rotation about an axis perpendicular to the xb direction and the yb direction. The twist component Sθtw becomes a positive value when the heel of the head 92 is located at a forward side of the toe (in a negative direction of the yb direction), and becomes a negative value when the heel of the head 92 is located at a rearward side of the toe (in a positive direction of the yb direction). Then, as an amount of twisting thereof increases, an absolute value of the twist component Sθtw increases.

Note that the definitions of the bend component Sxb in the xb direction, the bend component Syb in the yb direction, and the twist component Sθtw are not limited to those described above, and other definitions may be used as long as bending of the shaft 91 in a direction parallel to the face 921, bending of the shaft 91 in a direction perpendicular to the face 921, and twisting of the shaft 91 can be uniquely defined.

The sensor signal generation device 22 of the sensor 20 outputs a bend detection voltage signal including the bend component Sxb in the xb direction and the bend component Syb in the yb direction, and a twist detection voltage signal including the twist component Sθtw, which change as described above, to the feature data extraction unit 31 as sensor signals.

The feature data extraction unit 31 extracts feature data for estimating a swing state from the sensor signal. For example, the feature data extraction unit 31 detects a time when an absolute value of the sensor signal changes greatly, and detects this detection timing as hit timing (impact timing). The feature data extraction unit 31 extracts sensor signals in a period of a predetermined length from the hit timing, and outputs the sensor signals to the communication unit 341 as feature data.

By performing the above-described correction processing, changes in waveforms of the bend detection voltage signal and the twist detection voltage signal reflect a change in charge as is (see FIG. 4A and FIG. 4B. Thus, when hit timing is detected by a change in amplitude as described above, the feature data extraction unit 31 can detect timing at which the amplitude greatly changes with high accuracy. Accordingly, the feature data extraction unit 31 can extract feature data for estimating a swing state with higher accuracy.

The communication unit 341 transmits the feature data to a communication unit 342 of the second electronic device 12.

The second electronic device 12 is achieved by, for example, an information processing portable terminal such as a smart phone or an information processing device such as a personal computer, which is not installed at the golf club 90.

The second electronic device 12 includes the communication unit 342, a complex frequency spectrum calculation unit 32, an estimation unit 33 and a notification unit 40.

The communication unit 342 receives feature data from the communication unit 341 of the first electronic device 11. The communication unit 342 outputs the feature data to the complex frequency spectrum calculation unit 32.

The complex frequency spectrum calculation unit 32 performs complex Fourier transform processing on the feature data. Accordingly, the complex frequency spectrum calculation unit 32 generates a complex frequency spectrum (complex frequency component) of the feature data. The complex frequency spectrum calculation unit 32 outputs the complex frequency spectrum of the feature data to the estimation unit 33.

Here, as described above, the sensor signal generation device 22 performs correction with the complex frequency characteristics. Thus, amplitude and a phase of each of a bend detection voltage signal and a twist detection voltage signal are corrected. Accordingly, the complex frequency spectrum of the feature data reflects charge generated by the sensor element 21 as is. That is, the complex frequency spectrum calculation unit 32 can calculate a highly accurate complex frequency spectrum according to the charge generated by the sensor element 21.

The estimation unit 33 estimates a swing state using the complex frequency spectrum. The swing state includes, for example, at least one of a hit position of a ball on the head 92, hit strength, a holding state of the grip, a swing speed, and the like.

FIG. 8 is a graph showing an example of complex frequency spectra. The estimation unit 33 estimates a swing state using a peak frequency, a spectrum distribution, and the like of the complex frequency spectrum. Accordingly, by the complex frequency spectrum reflecting a change in the charge generated by the sensor element 21 with high accuracy, the estimation unit 33 can estimate the swing state with high accuracy.

The notification unit 40 is achieved by a display, a speaker, a lamp, or the like. The notification unit 40 performs notification according to the estimated swing state.

When the notification unit 40 is a display (corresponding to a "display unit" of the present disclosure), the notification unit 40 displays an image, a numerical value, a sensor signal, and the like of the face 921 of the head 92 according to the estimated swing state. At this time, the notification unit 40 may display a voltage signal before correction and a voltage signal after correction. Thus, an operator can visually and easily recognize whether or not the correction is performed with high accuracy.

Note that when the notification unit 40 is a speaker, the notification unit 40 changes a type of sound according to the estimated swing state and emits sound. In addition, when the notification unit 40 is a lamp, the notification unit 40 performs lighting, blinking or light emission of a colored light depending on a hit position according to the estimated swing state.

In addition, although the golf club is exemplified in the example of the present disclosure, the present disclosure is not limited thereto. The above-described configuration and processing can be applied to a shaft, not limited to the golf club, as long as a twist or bend occurs in the shaft.

(Communication Device)

A sensor element including a film-like main body containing polylactic acid as a main component (a polylactic acid sensor element) is easily applied to a curved surface or the like, and thus is used in various scenes. Accordingly, there is a demand for applying the polylactic acid sensor element to various observation targets.

Accordingly, an object of the present disclosure is to provide a communication device with which applications of a sensor element including a film-like main body containing polylactic acid as a main component can be increased.

The inventor of the present application looked up on the usages of a polylactic acid sensor element. And has found that the polylactic acid sensor element is basically connected to an arithmetic circuit by wiring. Thus, the usage of the polylactic acid sensor element are limited. Accordingly, the inventor of the present application has considered to manufacture a small communication device in which a polylactic acid sensor element and a wireless communication unit are integrated, and to attach the communication device to an observation target. The inventor of the present application has considered that since the communication device is small and, further, the sensor element is easily attached to a curved surface or the like, the sensor element can be applied to an observation target which is difficult to be measured in the related art.

However, the polylactic acid sensor element includes the film-like main body containing polylactic acid as a main component. Polylactic acid has a property of being easily denatured by electromagnetic waves. Thus, in general, it is not desirable to combine a wireless communication unit that emits electromagnetic waves with the polylactic acid sensor element. In particular, as described above, in a small communication device, a distance between the polylactic acid sensor element and the wireless communication unit is short, and thus, ordinarily, those skilled in the art are likely to be hesitant to manufacture a small communication device integrating the polylactic acid sensor element and the wireless communication unit.

Thus, the inventor of the present application has studied properties of the polylactic acid sensor element again. And noticed that the polylactic acid sensor element has structure in which the film-like main body containing polylactic acid as a main component is disposed between two electrodes. Thus, the inventor of the present application has found that an electromagnetic wave radiated by the wireless communication unit is prevented from reaching the film-like main body containing polylactic acid as a main component by the electrodes. Thus, the film-like main body containing polylactic acid as a main component is unlikely to be affected by the electromagnetic wave. Thus, the inventor of the present application has considered that it is possible to combine the polylactic acid sensor element and the wireless communication unit. Then, the inventor of the present application has conceived the following communication device 100.

Hereinafter, structure of the communication device 100 will be described with reference to the drawings. FIG. 9 is a block diagram of the communication device 100.

The communication device 100 includes a sensor element 110, a voltage signal generation circuit 120 and a wireless communication unit 130. The sensor element 110 includes a film-like main body containing polylactic acid as a main component, a first electrode, and a second electrode. The main body containing polylactic acid as a main component is provided between the first electrode and the second electrode. Note that the structure of the sensor element 110 is the same as that of the sensor element 21, thus description thereof will be omitted.

The voltage signal generation circuit 120 converts a physical quantity of an observation target outputted from the sensor element 110 into a voltage signal and outputs the voltage signal. The voltage signal generation circuit 120 corresponds to the charge amplifier 23 and the voltage amplifier circuit 24 in FIG. 1. However, the voltage signal generation circuit 120 may include the correction unit 25. Further, the voltage signal generation circuit 120 may include an analog-to-digital converter. The voltage signal has a voltage value according to the physical quantity of the observation target. The voltage value of the voltage signal indicates the physical quantity of the observation target.

The wireless communication unit 130 transmits a voltage signal obtained by the voltage signal generation circuit 120 converting the physical quantity of the observation target outputted from the sensor element 110 including the film-like main body containing polylactic acid as a main component. The wireless communication unit 130 transmits the voltage signal by an electromagnetic wave. A transmission destination of the voltage signal is, for example, a portable wireless communication device such as a smart phone.

The communication device 100 as described above has the following structure. Specifically, the sensor element 110, the voltage signal generation circuit 120, and the wireless communication unit 130 are integrated. Then, the communication device 100 is attached to an observation target in a state in which the sensor element 110, the voltage signal generation circuit 120 and the wireless communication unit 130 are integrated. Specifically, the sensor element 110, the voltage signal generation circuit 120, and the wireless communication unit 130 are fixed to a film with adhesive properties. The film is attached to an observation target such as a golf club. However, the sensor element 110, the voltage signal generation circuit 120 and the wireless communication unit 130 may be integrated by being accommodated in a housing.

Note that the communication device 100 is attached to an observation target in a state in which the sensor element 110, the voltage signal generation circuit 120, and the wireless communication unit 130 are integrated. Thus, for example, when a sensor element, a voltage signal generation circuit, a wireless communication unit and an observation target are accommodated in a housing, the communication device 100 does not include a device in which a sensor element, a voltage signal generation circuit, a wireless communication unit and an observation target are integrated. That is, the communication device 100 is a device to be retrofitted to an observation target.

According to the communication device 100, it is possible to increase applications of the sensor element 110 including the film-like main body containing polylactic acid as a main component. More specifically, in the communication device 100, the wireless communication unit 130 transmits a voltage signal obtained by the voltage signal generation circuit 120 converting a physical quantity of an observation target outputted from the sensor element 110 including the film-like main body containing polylactic acid as a main component. As described above, the communication device 100 including the sensor element 110 and the wireless communication unit 130 has characteristics of being small. Furthermore, the sensor element 110 can be easily attached to a curved surface or the like. Thus, according to the communication device 100, the sensor element 110 can measure an observation target for which deformation is difficult to be measured in the related art. From the above, according to the communication device 100, it is possible to increase applications of the sensor element 110 including the film-like main body containing polylactic acid as a main component.

REFERENCE SIGNS LIST

10 SWING STATE ESTIMATION DEVICE
11 FIRST ELECTRONIC DEVICE

12 SECOND ELECTRONIC DEVICE
20 SENSOR
21 SENSOR ELEMENT
22, 22M SENSOR SIGNAL GENERATION DEVICE
23 CHARGE AMPLIFIER
24 VOLTAGE AMPLIFIER CIRCUIT
25, 25M CORRECTION UNIT
31 FEATURE DATA EXTRACTION UNIT
32 COMPLEX FREQUENCY SPECTRUM CALCULATION UNIT
33 ESTIMATION UNIT
40 NOTIFICATION UNIT
100 COMMUNICATION DEVICE
110 SENSOR ELEMENT
120 VOLTAGE SIGNAL GENERATION CIRCUIT
130 WIRELESS COMMUNICATION UNIT
251 FOURIER TRANSFORM UNIT
252 CORRECTION CALCULATION UNIT
253 INVERSE FOURIER TRANSFORM UNIT
341, 342 COMMUNICATION UNIT
2521, 2522 CORRECTION CALCULATION UNIT
90 GOLF CLUB
91 SHAFT
92 HEAD
921 FACE

The invention claimed is:

1. A sensor signal generation device, comprising:

a voltage signal generation circuit configured to convert an electrical charge outputted from a sensor element into a voltage signal, and to output the voltage signal; and a processor configured to:

correct the voltage signal using a frequency characteristic of the voltage signal generation circuit, and output the corrected voltage signal as a sensor signal, wherein the frequency characteristic is a complex frequency characteristic, and wherein the complex frequency characteristic is F(ω)=fca(ω)×fva(ω), for a frequency ω, where F(ω) is the complex frequency characteristic, fca(ω) is a frequency characteristic of a charge amplifier of the voltage signal generation circuit, and fva(ω) is a frequency characteristic of a voltage amplifier circuit of the voltage signal generation circuit.

2. The sensor signal generation device according to claim 1, wherein the processor is configured to:

perform a Fourier transform on the voltage signal, correct the voltage signal after the Fourier transform by dividing the voltage signal by the frequency characteristic, and perform an inverse Fourier transform on the corrected voltage signal.

3. The sensor signal generation device according to claim 1, wherein the voltage signal generation circuit comprises:

a charge amplifier configured to convert the electrical charge into the voltage signal, and a voltage amplifier circuit configured to amplify the voltage signal outputted from the charge amplifier, wherein the processor is configured to correct a signal outputted from the voltage amplifier circuit by using the frequency characteristic, and wherein the frequency characteristic is a frequency characteristic of the charge amplifier and a frequency characteristic of the voltage amplifier circuit.

4. The sensor signal generation device according to claim 1, wherein fca(ω) is:

$$fca(\omega) = \frac{1}{\left[\left(1 + \frac{C_c}{C_p}\right)\omega + \frac{1}{jR_cC_p}\right]},$$

wherein fva(ω) is:

$$fva(\omega) = \frac{g\omega}{\left(1 + j\frac{\omega}{\omega_c}\right)},$$

where Cc is a capacitance of a charge amplifier of the voltage signal generation circuit, Rc is a resistance value of the charge amplifier of the voltage signal generation circuit, Cp is a capacitance of the sensor element, g is a gain of a voltage amplifier circuit of the voltage signal generation circuit, and ωc is a high cutoff frequency of the voltage amplifier circuit.

5. The sensor signal generation device according to claim 1, further comprising a display configured to display a waveform of the voltage signal and a waveform of the sensor signal.

6. A sensor device, comprising:

a sensor signal generation device comprising:

a voltage signal generation circuit configured to convert an electrical charge outputted from a sensor element into a voltage signal, and to output the voltage signal; and a processor configured to:

correct the voltage signal using a frequency characteristic of the voltage signal generation circuit, and output the corrected voltage signal as a sensor signal; and the sensor element attached to a shaft of a golf club and configured to generate the electrical charge according to a bending or a twisting of the shaft, wherein the sensor element comprises:

a main body that is polarized according to distortion due to the bending and the twisting; and a detection electrode that is configured to output the electrical charge due to the main body being polarized, wherein the voltage signal generation circuit is configured to generate a voltage signal due to the bending and a voltage signal due to the twisting, and wherein the processor is further configured to:

generate a sensor signal for bending by correcting the voltage signal due to the bending using a first frequency characteristic for the bending, and generate a sensor signal for twisting by correcting the voltage signal due to the twisting using a second frequency characteristic for the twisting.

7. A communication device, comprising:

a sensor element comprising a main body in a film shape containing polylactic acid;

a voltage signal generation circuit configured to convert an electrical charge outputted from the sensor element into a voltage signal, and to output the voltage signal; and a wireless transmitter configured to transmit the voltage signal, wherein the sensor element, the voltage signal generation circuit, and the wireless transmitter are integrated as a single unit, and wherein the communication device is attached to an observation target in a state in which the sensor element, the voltage signal generation circuit, and the wireless transmitter are integrated as the single unit.

8. The communication device according to claim 7, wherein the voltage signal has a voltage value according to the electrical charge caused by a movement of an observation target to which the sensor element is attached.

9. The communication device according to claim 7, wherein a voltage value of the voltage signal indicates the electrical charge caused by a movement of an observation target to which the sensor element is attached.

10. A communication device, comprising:

a sensor element comprising a main body in a film shape containing polylactic acid;

a voltage signal generation circuit configured to convert an electrical charge outputted from the sensor element into a voltage signal, and to output the voltage signal; and a wireless transmitter configured to transmit the voltage signal, wherein the sensor element further comprises a first electrode and a second electrode, and wherein the main body containing polylactic acid is between the first electrode and the second electrode.

11. The communication device according to claim 10, wherein the voltage signal has a voltage value according to the electrical charge caused by a movement of an observation target to which the sensor element is attached.

12. The communication device according to claim 10, wherein a voltage value of the voltage signal indicates the electrical charge caused by a movement of an observation target to which the sensor element is attached.

* * * * *